United States Patent [19]

Benesh et al.

[11] Patent Number: 5,514,964

[45] Date of Patent: May 7, 1996

[54] SYSTEM FOR MONITORING A DUAL VOLTAGE UNGROUNDED SYSTEM FOR LEAKAGE CURRENTS

[75] Inventors: Stephen P. Benesh; David W. Hasenohrl, both of Oshkosh, Wis.

[73] Assignee: Square D Company, Palatine, Ill.

[21] Appl. No.: 292,121

[22] Filed: Aug. 17, 1994

[51] Int. Cl.$^6$ .................................................. G01R 31/14
[52] U.S. Cl. ............................................ 324/509; 324/527
[58] Field of Search ................................. 340/650, 651; 324/509, 510, 107, 127, 128, 527

[56] References Cited

U.S. PATENT DOCUMENTS

| | | | |
|---|---|---|---|
| 3,737,765 | 6/1973 | Lee et al. | 324/510 |
| 4,206,398 | 6/1980 | Janning | 340/651 |

*Primary Examiner*—Ernest F. Karlsen
*Assistant Examiner*—Russell M. Kobert
*Attorney, Agent, or Firm*—Michael J. Femal; Richard J. Graefe; Larry I. Golden

[57] ABSTRACT

A system contained on a single isolation panel determines the hazard current of a dual voltage, ungrounded, polyphase system. The system uses a single isolation transformer having dual secondary windings for generating the dual voltages. A first line isolation monitor or LIM, is microcontroller based and continuously measures the fault impedance of one of the output voltages of the polyphase, ungrounded or isolated system. A second LIM continuously measures the fault impedance of the other output voltage of the system. The fault impedance is determined by the LIM by injecting a continuous sine wave measurement current into a ground terminal to generate a measurement voltage across the fault impedance. Using the measurement voltage and current, the LIM calculates the fault impedance and, using this impedance, calculates the hazard current based on the maximum line to ground voltage of the ungrounded system. The hazard current is displayed and if it exceeds a predetermined threshold, the LIM will provide audio and visual alarms. A serial communications channel allows the LIM to communicate with other intelligent devices. The LIM has means for self-calibration and self-testing while on-line and during a power-up sequence. Line frequency is also determined by the LIM. The two LIMs can be used to monitor the dual distribution system at the same time without interfering with each other.

11 Claims, 6 Drawing Sheets

SYSTEM FOR MONITORING A DUAL VOLTAGE UNGROUNDED SYSTEM FOR LEAKAGE CURRENTS

TECHNICAL FIELD

Applicants' invention relates generally to a system for monitoring ungrounded polyphase power distribution systems and more particularly to a system that uses a microprocessor based line isolation monitor (LIM) for detecting and indicating the magnitude of hazard leakage current between ground and each separate isolated voltage loop in the distribution system.

RELATED APPLICATIONS

This application is related to the following, commonly assigned applications filed concurrently herewith, entitled "Monitor For An Ungrounded System" (application Ser. No. 08/215,435, Our Docket OSH-1), "System For Calibrating A Line Isolation Monitor" (application Ser. No. 08/215,437, Our Docket OSH-2), and "System For Measuring Line To Ground Impedance" (application Ser. No. 08/215,347, Our Docket OSH-3). The contents of these applications are expressly incorporated herein by reference.

BACKGROUND ART

Standards set by the National Fire Protection Association (NFPA) as detailed in the National Electric Code, Article 517-104 require that each power circuit within an anesthetizing location, such as in a hospital operating room, shall be ungrounded and isolated from any distribution system supplying other, non-anethetizing locations. Additionally, other articles of the NFPA have a requirement that a monitor must also be used with an ungrounded system that could be used in a "wet location" where hospital patients might be present. The monitor must provide a continuous indication of possible leakage or fault currents from any of the isolated conductors to ground. This requirement is for the safety of the patient. The monitor and related components are mounted on an isolation panel located within the anesthetizing location or hospital operating room. The normal high impedance of the human body can be bypassed during certain medical procedures such as when electrodes or probes are used to monitor heart activity, for instance. Under these conditions, alternating current flowing through the body could produce extreme shock or even death.

The ideal isolated conductor in an ungrounded system has infinite impedance to ground and no current flow would result if a short circuit or very low impedance was placed between the conductor and ground. In the real world, however, there are no perfect insulators. All isolated conductors experience some capacitive or resistive leakage current to ground. Insulation deteriorates with age and use. Capacitive leakage are inherently present in all systems. Both types of leakages increase by the number of devices connected to the system and the length of the conductors themselves. These leakages provide a current path to ground and if a grounded low impedance is connected to the isolated conductor, as might be the case with a heart monitor, the current has a return path due to the leakages. Total hazard current is defined as the total current that would flow through a low impedance conductor connected between ground and the isolated conductor. Total hazard current is a combination of fault hazard current, that current that results from all user devices, except for a LIM, connected to the isolated system, and monitor hazard current, that current that results only from a LIM connected to the isolated system. The NFPA standards require a visual and audible warning if the total hazard current exceeds a predetermined limit and also limits the amount of current attributed to the monitor.

Several types of LIMs have been available for some time. These include static ground detector and dynamic LIMs. These types, although somewhat effective, did not offer continuous monitoring, were somewhat difficult to use, and also added a large amount of hazard current to the total hazard current. One type of dynamic LIM that overcame some of these problems is disclosed in commonly assigned U.S. Pat. No. 3,976,987. A DC reference voltage, proportional to the maximum voltage to ground from either conductor of a two wire ungrounded system is determined and used as a reference voltage for the system. A capacitive component and a resistive component are generated from the reference voltage and are applied across the system leakage impedances in parallel. Circuitry within the LIM separates the impedance voltage response from the line voltage response to produce a difference signal. This signal is used to derive a combined resistive and capacitive component signal representing the maximum hazard current of the system.

If more than one isolated power circuit is within the anesthetizing location or operating room, a separate isolation panel must be used for each circuit. Operating rooms, for instance, usually require heart monitoring equipment that operates from a 120 VAC source and X-ray equipment operating at 240 VAC. This requires two isolation transformers to provide the voltages. A more effective system would be to generate these voltages from a single transformer with multiple secondaries. Prior art LIMs however, are not capable of being coupled to the same transformer at the same time due to LIM to LIM interference. It would be desirable to provide an isolation panel having line isolation monitors that overcome these disadvantages and includes other features that accurately computes the hazard current of the dual ungrounded power system.

SUMMARY OF THE INVENTION

Accordingly, the principal object of the present invention is to provide an improved system for determining the hazard current of a dual voltage, ungrounded, polyphase system.

A further objective of the invention is to provide an isolation panel having a single isolation transformer for generating a plurality of voltages.

An additional objective of the invention is to provide an isolation panel for generating a plurality of isolated voltages having a means of communicating measured and calculated parameters with other peripheral devices.

In the preferred embodiment of the invention, a first LIM, which is a digital line isolation monitor, is microcontroller based and continuously measures the fault impedance of one of the output voltages of the polyphase, ungrounded or isolated system. A second LIM continuously measures the fault impedance of the other output voltage of the system. The LIMs could be used to monitor the hazard current of an isolated power system as used in a hospital, or the leakage current of an isolated power system as used in a marina. The LIMs could also be used to detect the degradation of insulation of electrical motors coupled to isolated power systems. The first LIM injects a continuous sine wave measurement current into the ground terminal of one voltage loop of the dual voltage isolated system. This sine wave current signal is precise with respect to its frequency and phase angle from cycle to cycle. This current creates a test voltage across the hazard impedance. The microcontroller generates the precision phase sine wave signal that has a frequency that is a multiple of the line frequency of the isolated system, which is also determined by the microcontroller. The microcontroller uses the line frequency to calculate the actual capacitive reactance at the power line frequency. A frequency selective current to voltage converter locked to the test current frequency, measures the injected current. For each phase, a frequency selective amplifier with appropriate filtering, measures the voltage to ground potential, which is the sum of the test voltage and the actual line voltage to ground. The sum of the test voltages from each phase to ground is computed. Knowing the magnitude and the phase of the test current and the test voltages, the microcontroller calculates the hazard impedance using Ohms law z(eq)=v/i. The equivalent shunt resistance and capacitance are also calculated. Knowing the hazard impedance, the maximum hazard current to ground is determined by the relationship Ihmax=(Largest phase voltage)/Z(eq).

The microcontroller determines the largest phase voltage. The hazard current is displayed on a two digit display and an analog bar graph. When the total hazard current, which includes both resistive and capacitive leakage currents, reaches a predetermined alarm threshold, the LIM produces visual and audible alarms. The microcontroller calculates the hazard current at least once every five seconds.

The second LIM coupled to the other voltage loop also injects a continuous sine wave measurement current into the ground terminal of the isolated system. This sine wave current signal is at a different test frequency than from the first LIM. Since the current and voltage measurements are frequency selective, the two LIMs can share the same isolation transformer without interference with each other.

Other features and advantages of the invention, which are believed to be novel and nonobvious, will be apparent from the following specification taken in conjunction with the accompanying drawings in which there is shown a preferred embodiment of the invention. Reference is made to the claims for interpreting the full scope of the invention which is not necessarily represented by such embodiment.

DETAILED DESCRIPTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

Figure 1A:
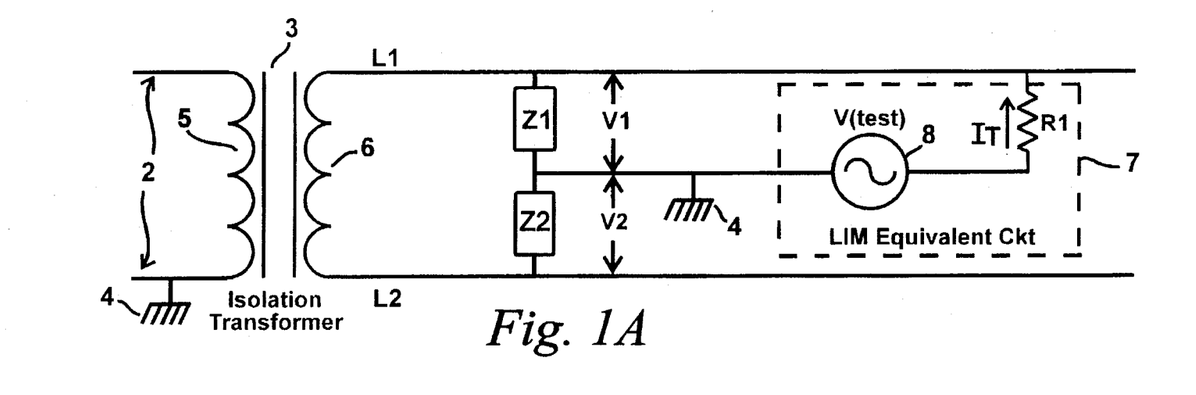
FIGS. 1A, 1B and 1C are effective circuit diagrams to illustrate the main principle of operation of a line isolation monitor connected to an isolated power system.
Figure 1B:
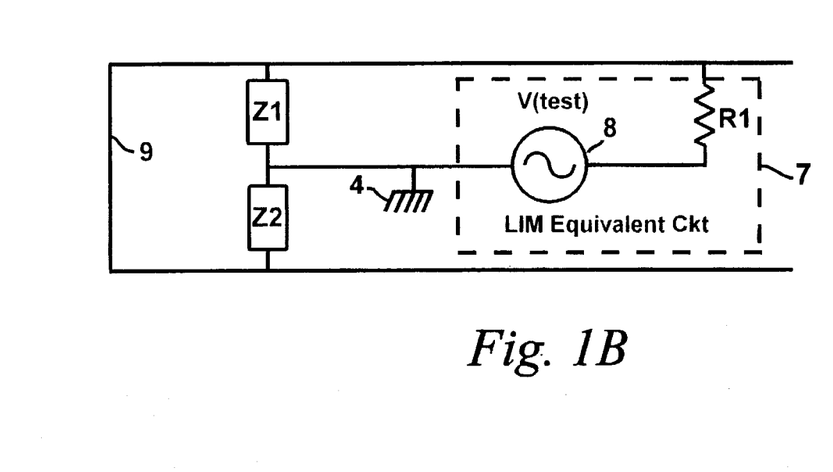
Figure 1C:
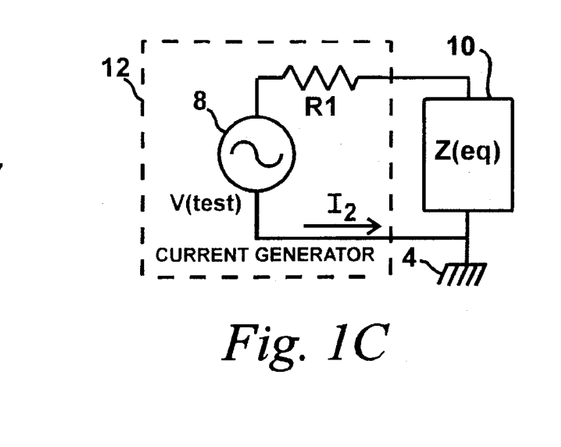

FIGS. 1A, 1B, and 1C illustrate a typical isolated power supply system having conductors L1 and L2. A grounded system 2 connected to earth ground 4 is connected to a primary winding 5 of isolation transformer 3. L1 and L2 are coupled to a secondary winding 6 of transformer 3. Impedances Z1 and Z2 are called the hazard impedances and represent stray resistance and capacitance to earth ground 4. For a perfectly isolated system, Z1 and Z2 are infinity ohms and a grounded, low impedance object would experience no current flow if it came in contact with either L1 or L2 and ground. However, all isolated and ungrounded systems have some resistive and capacitive leakage to ground caused by the fact that there are no perfect insulators. Some current flow will therefore result if that grounded object contacts L1 or L2. The total current that could flow is defined as a hazard current. V1 and V2 are the line voltages measured to ground from L1 and L2, respectively, using conventional methods. To measure the equivalent impedance to ground, a test signal is injected into the isolated system by LIM 7. A test current It is generated by the LIM 7 and injected into the ground terminal 4. A voltage generator 8 produces a voltage V(test) having a predetermined amplitude and frequency. The current through R1, having a known resistance, becomes the test current It and its value is easily calculated since V(test) and R1 are known. This current It creates a test voltage V1, V2 across the impedances Z1 and Z2, respectively. The impedances Z1 and Z2 in turn, can then be calculated through Ohms law since the current It is known and the test voltages V1, V2 across the hazard impedances can be measured.

Since the secondary winding 6 has a very low impedance to the test current It, it can be replaced by a short circuit 9 as shown in FIG. 1b and rearranged in FIG. 1c whereby Z(eq) 10 is the equivalent impedance of the parallel combination of Z1 and Z2. This shows that a Thevenin equivalent impedance can be measured using a current generator 12, represented by voltage generator 7 and resistor R1, from L1 or L2 to ground. The equivalent impedance Z(eq) is calculated by dividing the voltage across the current generator 8 by the generator current. Once Z(eq), the hazard impedance, is determined, maximum hazard current can be calculated using the greater line to ground voltage of either V1 or V2. Most LIMs will utilize this principle to monitor the isolated power circuit.

Figure 2:
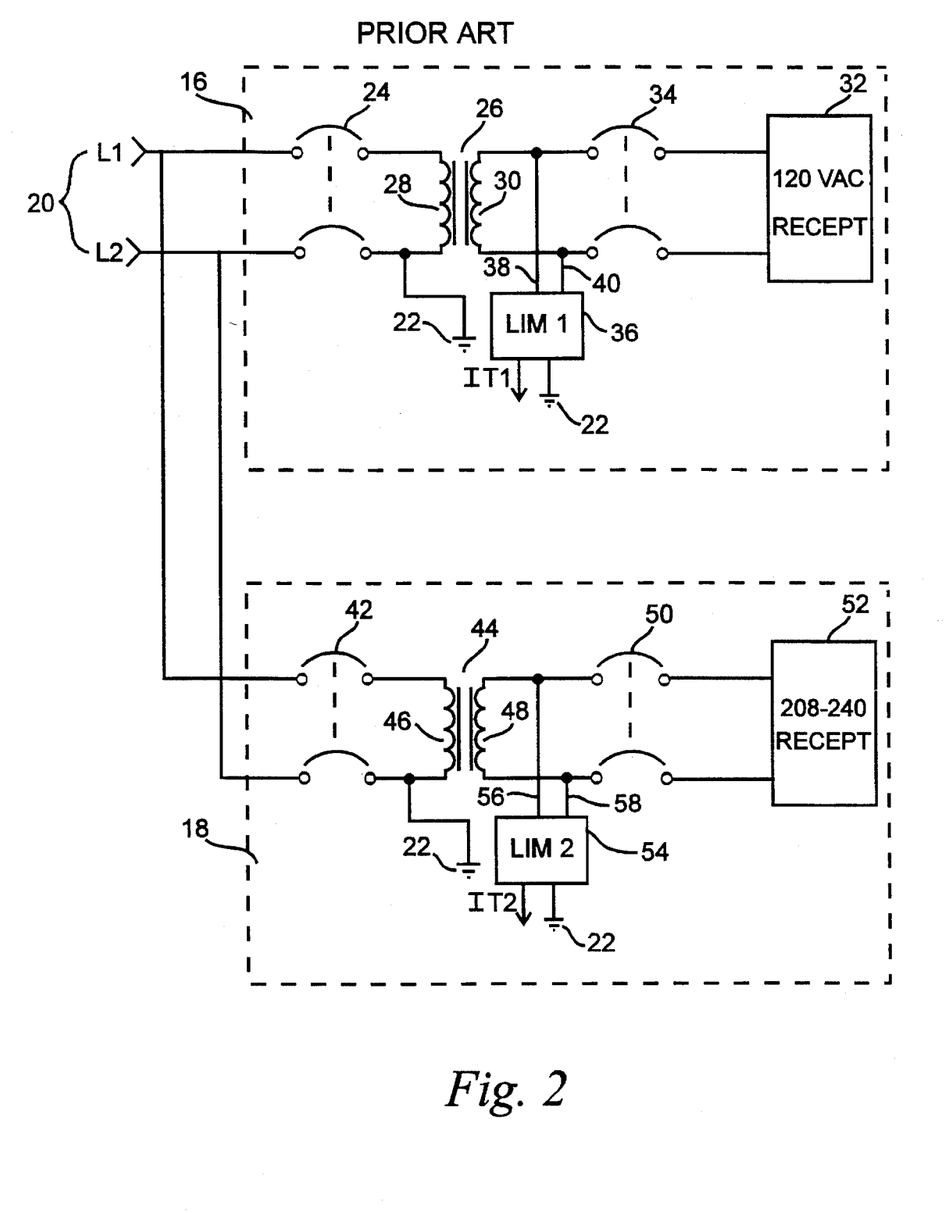
FIG. 2 is a block diagram of a dual voltage, ungrounded system utilizing line isolation monitoring constructed according to the prior art.

If more than one isolated power circuit is within the anesthetizing location or operating room, separate isolation panels must be used for each circuit. This is to prevent cross coupling of the injected test currents from interfering with each other if they are on the same isolation panel. FIG. 2 illustrates a typical prior art system presently in use in these locations having a first isolation panel 16 and a second isolation panel 18. A grounded power source 20 supplies L1 and L2 and ground 22 to both panels 16, 18. For panel 16, a double pole circuit breaker 24 couples L1 and L2 to the primary 28 of isolation transformer 26. The isolated secondary 30 supplies 120 VAC to receptacles 32 through a double pole circuit breaker 34. Multiple circuit breakers could be used to provide the 120 VAC to various branch circuits, if required. LIM1 36 injects a test current IT1 into ground 22 and monitors the line to ground voltages 38, 40 to calculate the maximum hazard current for the 120 VAC isolated power. Similarly, for panel 18, double pole circuit breaker 42 couples L1 and L2 to the primary 46 of isolation transformer 44. The isolated secondary 48 supplies either 208 or 240 VAC to receptacles 52 through double pole circuit breaker 50. Multiple circuit breakers could also be used to provide 208 or 240 VAC to various branch circuits. LIM2 54 injects test current IT2 into ground 22 and monitors the line to ground voltages 56, 58 to calculate the maximum hazard current for the 208 or 240 VAC isolated power system.

Figure 3A:
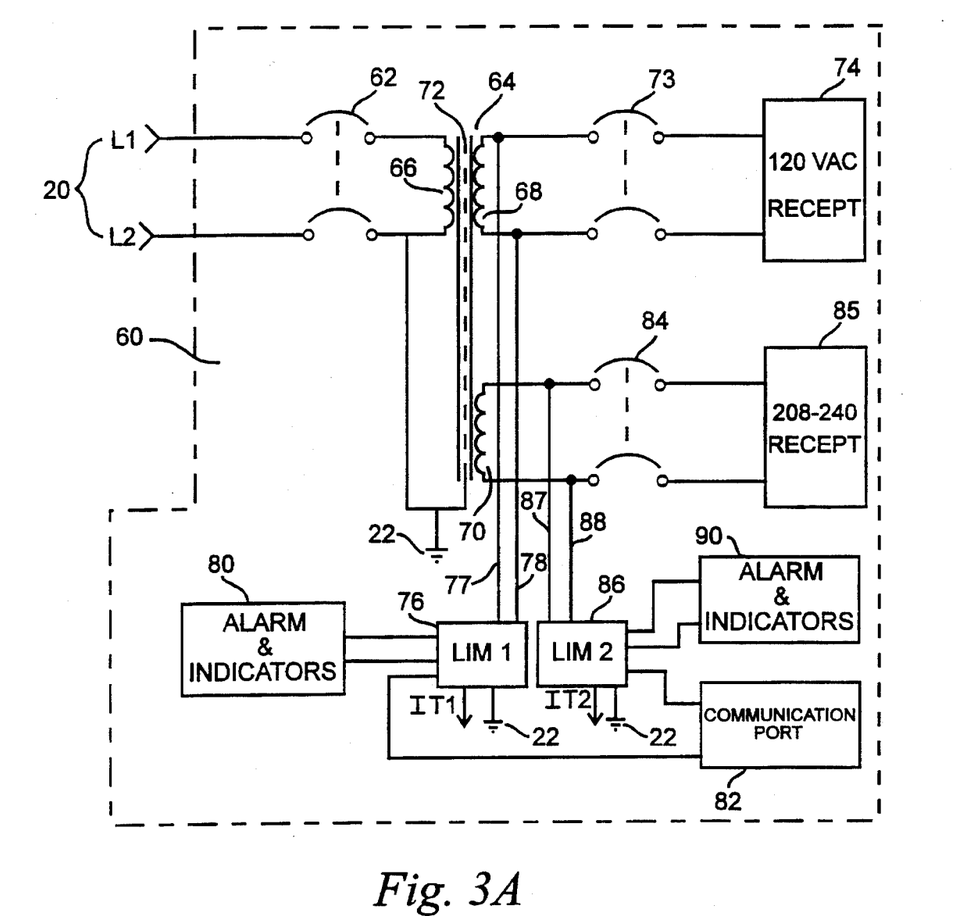
FIGS. 3A, 3B and 3C are block diagrams of dual voltage, ungrounded systems utilizing line isolation monitoring constructed according to the present invention.
Figure 3B:
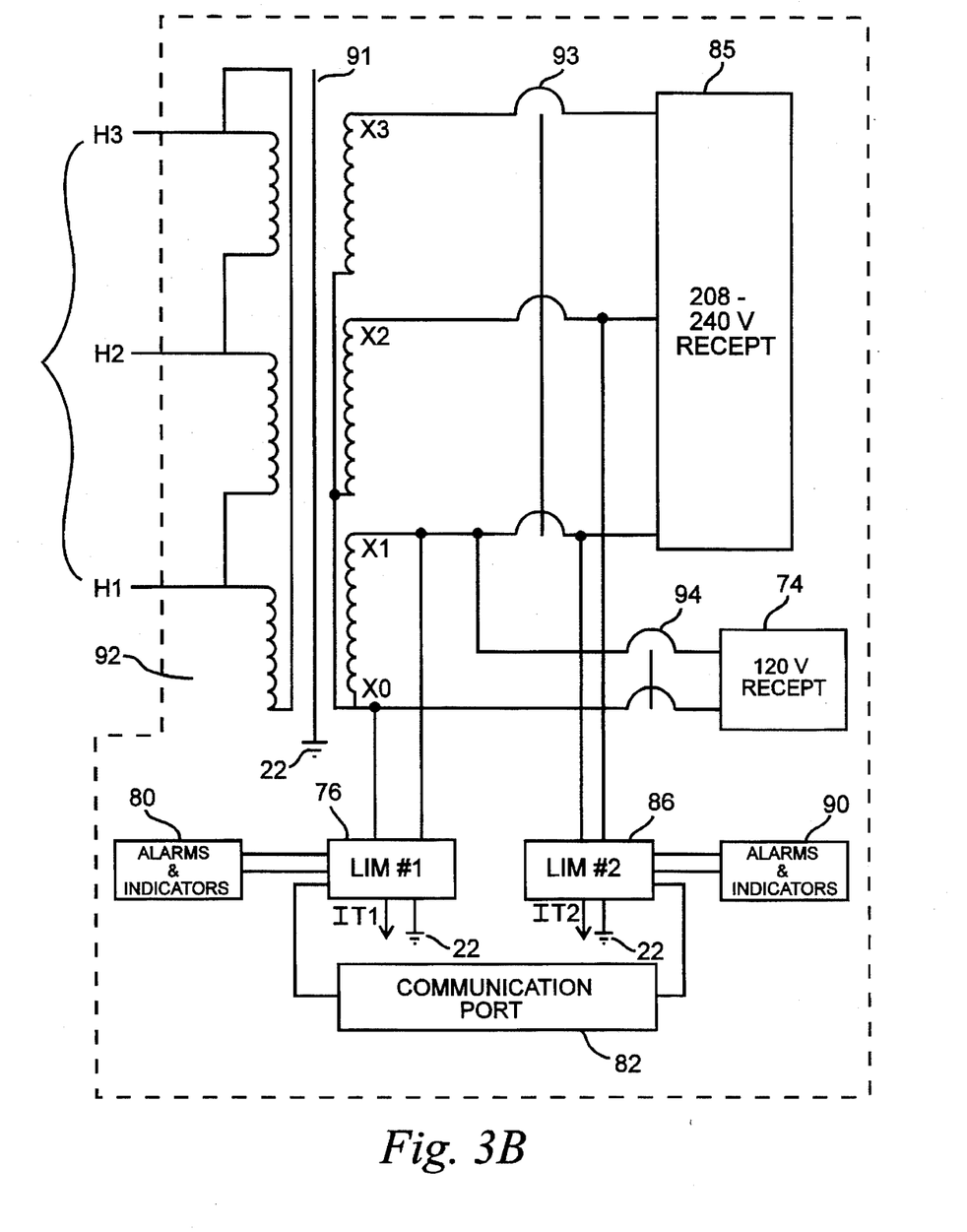
Figure 3C:
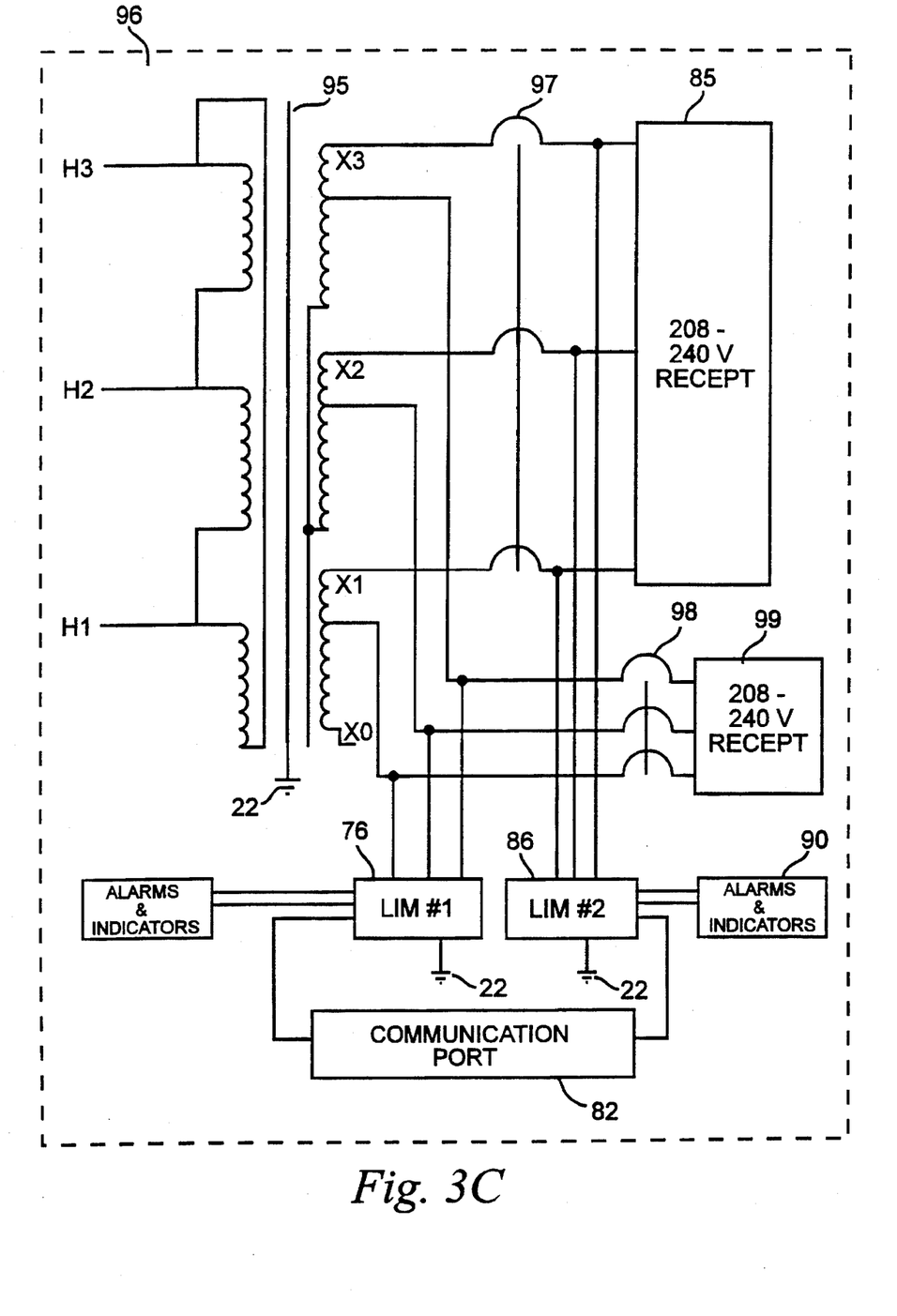

The preferred embodiment of the present invention is exemplified in FIG. 3A. Isolation panel 60 has a single transformer 64 which is supplied with incoming line voltage 20 through multipole circuit breaker 62 coupled to primary winding 66. Although a two phase system is shown, it should be understood that the present invention is not limited to a two phase system and is applicable to a three phase system as well. FIGS. 3b and 3c show some of the possible configurations for three phase systems. Secondary winding 68 generates 120 VAC and the other secondary winding 70 generates the 208–240 VAC. Transformer 64 may have an electrostatic shield 72 connected to earth ground 22. Since the secondary windings 68, 70 are ungrounded, a primary-secondary failure may not trip circuit breaker 62 and could result in high secondary voltages due to auto transformer action. If a shielded transformer is used, a failure in the primary will be shorted to the shield and shunted to ground, causing the circuit breaker to trip. Ground 22 could be connected to an equipotential grounding system common in most operating rooms and required by code in many instances. Double pole circuit breaker 73 couples the 120 VAC isolated secondary winding 68 to receptacles 74. Multiple circuit breakers could be used to provide 120 VAC to various branch circuits within the operating room. LIM1 76 injects a test current IT1 into ground 22 and monitors the line to ground voltages 77, 78 from the secondary winding 68 to calculate the maximum hazard current for the 120 VAC isolated power system. An alarm and indicator module 80 indicates the condition of LIM1 76. The alarms include an audible alarm and various combinations of indicating lights such as a green light for safe, i.e., hazard current below a preset level and a red light for hazard current above this level. A further option possible with the present invention is the addition of a communication port 82 that provides an isolated means of communicating with external monitoring devices and other equipment.

The 208/240 VAC isolated power system generated from the secondary winding 70 includes double pole circuit breaker 84 and receptacles 85. As above, multiple circuit breakers could also be used to provide 208 or 240 VAC to various branch circuits. Since this voltage is generally used with X-ray equipment, if more than one receptacle is powered from this system, interlocking switching could be included with the receptacles or outlets to prevent more than one outlet from being energized at a time. LIM2 86 injects test current IT2 into ground 22 and monitors the line to ground voltages 87, 88 from secondary winding 70 to calculate the maximum hazard current for the 208/240 VAC isolated power system. Alarm and indicator module 90 indicates the condition of LIM2 86. The alarms and various combinations of indicating lights operate as above. Communication port 82 is also coupled to LIM2 86 to provide a means of communicating with external monitoring devices and other equipment.

In FIG. 3B, an isolation panel 92 has a three phase transformer 91 having three phase inputs H1, H2, and H3 connected to its primary windings. The 208/240 VAC receptacles are coupled to secondary winding leads X1, X2, and X3 through circuit breaker 93 and the 120 VAC receptacles are coupled to secondary winding leads X0 and X1 through circuit breaker 94. LIM1 monitors the 120 VAC lines and LIM2 monitors the 208/240 VAC lines. In FIG. 3C a slightly different configuration is shown whereby an isolation panel 96 has a three phase transformer 95 has the three phase secondary leads X1, X2, and X3 supplying parallel 208/240 VAC receptacles. Other configurations are possible and the output voltages could be at different magnitudes, such as 100 VAC.

As previously mentioned, this type of isolation panel was not possible before since the two test currents IT1 and IT2 would interact with each other, resulting in erroneous data. The present invention, however, overcomes this interference by generating the test currents IT1 and IT2 at different frequencies from each other. The first line isolation monitor LIM1 injects a continuous sine wave measurement current into the ground terminal 22. This sine wave current signal IT1 is precise with respect to its frequency and phase angle from cycle to cycle. This current creates a test voltage across the hazard impedance. LIM1 has a frequency selective current to voltage converter locked to the test current IT1 frequency to measure the injected current. Then, for each phase of the isolated 120 VAC system, a frequency selective amplifier with appropriate filtering, within LIM1 measures the voltage to ground potential 77 or 78, which is the sum of the test voltage and the actual line voltage to ground. The sum of the test voltages from each phase to ground is computed. Knowing the magnitude and the phase of the test current and the test voltages, LIM1 76 calculates the hazard impedance. Knowing the hazard impedance, the maximum hazard current to ground can then be determined. The second line isolation monitor LIM2 86 also injects a continuous sine wave measurement current IT2 into the ground terminal 22. This sine wave current signal IT2 is also precise with respect to its frequency and phase angle from cycle to cycle and creates a test voltage across the hazard impedance. Its frequency is different from that created by LIM1 76. A frequency selective current to voltage converter locked to the test current IT2 frequency in LIM2 86 measures the injected current IT2. Test current IT1 will not be factor and interfere with test current IT2 and vice versa. Therefore, for each phase of the isolated 208/240 VAC system, a frequency selective amplifier with appropriate filtering, within LIM2 measures the voltage to ground potential 87 or 88, to calculate the hazard impedance for the isolated 208/240 VAC system and the maximum hazard current to ground.

Figure 4:
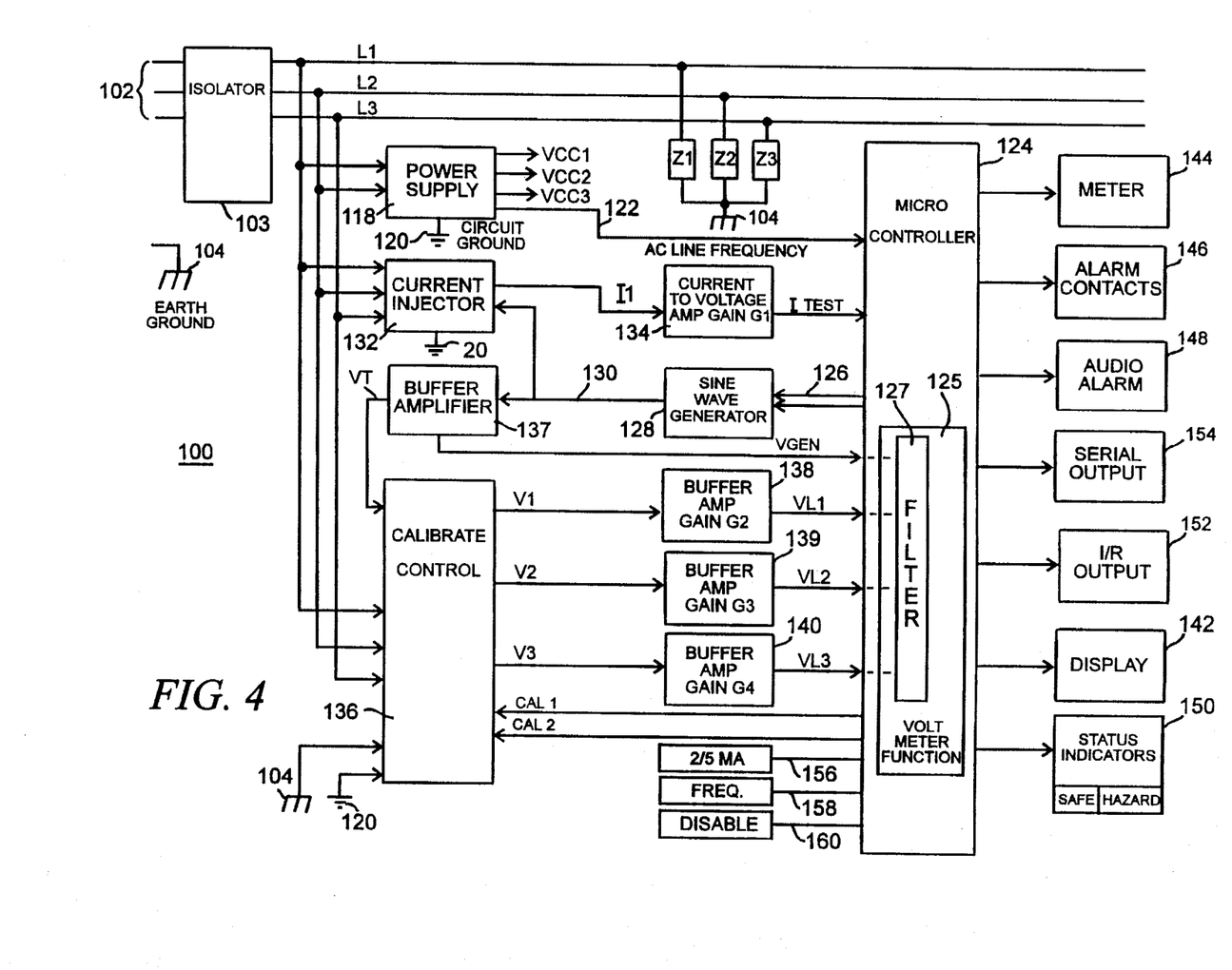
FIG. 4 is a schematic block diagram of a line isolation monitor for use in a dual voltage, ungrounded system according to the present invention.

Details of a line isolation monitor LIM 100 which is physically identical to LIM1 and LIM2, are disclosed in commonly assigned, pending application Ser. No. 08/215,435 entitled "Monitor For An Ungrounded System." A schematic block diagram of LIM 100 is shown in FIG. 4. A more detailed description is disclosed in the above referenced application and are incorporated herein by reference. A three phase system is detailed, but operation as a single phase system is the same. The isolated and ungrounded system has conductors L1, L2, and L3 which are isolated from a grounded system 102 having a ground terminal 104 by some isolation means 103. The ungrounded system could be of any type such as from a generator, an inverter system from a UPS system, or an isolation transformer. Hazard impedance in each leg is designated by Z1, Z2, and Z3, respectively. A power supply 118 connected to L1 and L2 generates the circuit supply voltages and circuit ground 120. Signal 122 is used by a microcontroller 124 to determine the line frequency of the ungrounded system. Microcontroller 124 contains at least a CPU, a memory and analog to digital (A/D) converters. All signal processing, calculations, control signals, and outputs are controlled by the microcontroller 124. The microcontroller 124 generates digital signals 126 that go to a sine wave generator 128 to produce a sine wave signal 130. These signals 126 are generated 16 times per cycle at a predetermined frequency which is related to a multiple of the line frequency signal 122. A hardware low pass filter smooths output 130 to make it continuous between sample points. Current injector 132 is driven by sine wave signal 130 to create a test current I1 which is injected into L1, L2 and L3 and is used to determine the hazard impedance as previously discussed. A current to voltage converter 134 measures the injected current and sends a signal ITEST to the microcontroller 124.

A calibration control 136 provides switching functions between monitoring the line voltages V1–V3 and a calibration voltage Vt generated from sine wave signal 130 by buffer amplifier 137 during calibration and also provides the means for injecting the test current I1 into earth ground 104. Control signals CAL1 and CAL2 are generated by microcontroller 124 during the calibration procedure or test mode. In normal operation when LIM 100 is monitoring and measuring the hazard current, line voltages V1–V3 are coupled to buffer amplifiers 138–140 having gains of G2, G3, and G4, respectively.

Buffer amplifier 138 measures the L1 voltage to ground V1 which is the sum of the L1 voltage to ground and the test voltage created from the injected test current I1. Output VL1 is equal to V1*G2. Using the relationship that V1=(IV*G2)/G2, the microcontroller 124 calculates the actual V1 voltage to ground. The gain G2 is measured and is checked during calibration to ensure that it has not changed and is within predetermined tolerances. In a similar manner, voltages V2 and V3 to ground are calculated and gains G3 and G4 are measured by the microcontroller 124. The microcontroller 124 will add the VL1 and VL2 signals. Each of these signals is the algebraic sum of the line voltage to ground, which is at line frequency, and the test voltage signal, having a frequency that is a multiple of the line frequency. Since the test voltage component to ground has the same phase and amplitude relationship for VL1 and VL2, the sum will be double the amplitude of the test voltage. The line frequency signals L1 and L2 to ground are 180 degrees out of phase, and will be cancelled when summed together if the impedances Z1 and Z2 are equal. If unequal, L1 and L2 will not cancel, but the test voltage is still doubled, increasing the ratio of the test voltage to the line voltage over the case of measuring the test signal to ground on a single line. A frequency selective voltmeter function 125 within the microcontroller 124 locked to the frequency and phase of the test current measures the sum of the test voltages from L1 and L2 to ground. Likewise, a frequency selective ammeter function also locked to the frequency and phase of the test current measures the current injected into the system. With these quantities calculated, the microcontroller 124 then calculates a complex hazard impedance using Ohms law z(eq)=v/i. The equivalent shunt resistance and capacitance are also calculated. Since these quantities are complex numbers, both magnitude and phase are calculated. Additionally, the calculated hazard impedance must be corrected to represent the impedance at line frequency since the test current is not at the same frequency as the line frequency. The impedance is modeled as a resistor-capacitor parallel combination. Although the real part is not frequency dependent, the imaginary part is frequency sensitive. To correct for this difference, the imaginary part of the impedance, expressed as an admittance, is multiplied by the ratio of the line frequency to the test frequency to give the admittance at the line frequency.

In order for the microcontroller 124 to calculate the amplitude and phase of the complex phase voltages VL1–VL3, a discrete Fourier transform (DFT) process is used. Since the injected test current I1 is generated by the microcontroller 124, the measured voltages are phase coherent with the measurement signals. The DFT acts as a frequency selective filter 127, phase locked to the frequency of the test signal, and separates the real and imaginary parts of the measured signals using the following equations:

$$\text{REAL PART} = K \sum_{0}^{n} Vn \, \text{SIN}(\theta) \qquad eq. \ 1$$

and $$\text{IMAGINARY PART} = K \sum_{0}^{n} Vn \, \text{COS}(\theta) \qquad eq. \ 2$$

As is obvious to one skilled in the art, other Fourier Transforms such as a Fast Fourier Transform (FFT) could be used in place of the DFT function. The sums are calculated over multiple cycles of the test frequency. Vn is the value of the input voltage being measured, VL1, VL2, or VI3, at position θ in the cycle. These sums are scaled to represent the real and imaginary parts of the input voltage. Values for the sine and cosine functions are taken from lookup tables programmed into the microcontroller 124. To reduce errors caused by spectral leakage, the input voltages are first windowed using a modified Kaiser-Bessel window. This modification involves the use of discrete points in the window function to represent the window function at a given position. This allows for a decrease in the size of the window function.

Knowing the hazard impedance, the maximum hazard current to ground is determined by microcontroller 124 using the relationship Ihmax=(Largest phase voltage)/Z(eq).

The microcontroller 124 measures the phase voltages V1–V3 and determines the largest of the phase voltages V1–V3 using a DFT tuned to the line frequency.

The hazard current is displayed on a display panel 142 having a two digit display for displaying the hazard current in milliamperes (mA), a single digit for displaying a threshold current, and an analog bar graph for displaying a percentage, from 0 to 160 percent, of the threshold current. The threshold current can be set for either 2 mA or 5 mA and is the point whereby the LIM 100 will indicate a safe condition if the measured hazard current is below the threshold and a hazard condition if the hazard current is above the threshold. An analog signal is also created by the microcontroller 124 to drive a remote analog meter 144 for also displaying the hazard current. When the total hazard current, which includes both resistive and capacitive leakage currents, reaches the predetermined alarm threshold, double pole alarm contacts 146, audible alarm 148, and visual status indicator 150 are energized from signals generated by microcontroller 124. One set of contacts of alarm contacts 146 is uncommitted, allowing the user to control a variety of different devices. The other set of contacts supplies an isolated low voltage from an isolated secondary from a transformer in power supply 118 that can be used to control a remote annunciator such as Square D Company models IA-1C and M5-IA1.

The microcontroller 124 calculates the hazard current at least once every five seconds. Since the current and voltage measurements are frequency dependant, microcontroller 124 has provisions for changing the frequency of the sine wave generator 128 and thus the frequency of the injected test current. Since the DFT voltmeters are very frequency selective, this will allow two different line isolation monitors, operating at different test current frequencies, to share the same ungrounded system without interference from each other, which is the main object of the present invention.

Microcontroller 124 also has provisions for broadcasting data through an infrared port 152 and a serial communications port 154. The serial communications channel 154 provides for one way communication with a peripheral device to communicate measured and calculated parameters and other pertinent data. The infrared port 152 will also output this information approximately every two seconds. This information will include line to ground RMS voltages, shunt impedance, test current and voltages, hazard current, number of watchdog time-outs or spurious interrupts, and the cause of last microcontroller reset. The infrared port allows for ground isolation between the system and the remote location receiving the infrared signals. The serial data is in ASCII format using the Hewlett Packard HP-95LX serial infrared protocol, although other protocols are possible.

Microcontroller 124 receives various inputs from program switches to control the configuration of LIM 100. Switch 156 determines if the hazard alarm threshold will be 2 mA or 5 mA. Switch 158 determines the frequency of the voltage test signal VT from the LIM 100, allowing two different LIMs to monitor the same system without interference from each other. Switch 160 disables the audio alarm 148. When this is in the OFF position, the audio alarm will be disabled. The alarm will sound, however, for calibration warnings, LIM faults and missing ground faults.

LIM 100 has various indicators 150 to provide a visual indication of its status. A green SAFE LED is used to indicate that the hazard current is below the threshold level selected, either 2 mA or 5 mA. A red HAZARD LED DS4 when lit, indicates that the hazard current is above the threshold level, or indicates that an error condition exists for the LIM 100 itself. This error condition does not imply that the power system is unsafe, but is meant to alert the user that its safety is unknown since the LIM 100 may not be monitoring the power line accurately.

In addition to controlling a bar graph display 142, the microcontroller 124 has other outputs for conveying the status of the LIM 100 and the power system it is monitoring. This includes a pulse width modulated output that is proportional to the hazard current. This provides a method for driving the analog meter 144 that would be at a location remote from the LIM.

While the specific embodiments have been illustrated and described, numerous modifications are possible without departing from the scope or spirit of the invention. Although in the foregoing embodiments have been applied to single and three phase systems, it will be clearly understood that the invention is equally applicable to polyphase systems. Further, it should also be noted that a single transformer having triple or quad secondaries could also be monitored in this fashion. The individual windings are coupled to separate line isolation monitors constructed to generate and inject test currents having different frequencies and having internal frequency selective current and voltage measurements. The present invention is not to be restricted to just a dual voltage system.

We claim:

1. A system for continuously monitoring a hazard current between line conductors of a dual voltage, ungrounded polyphase power distribution system and ground, said system comprising;

A. an isolation transformer, said transformer having a primary winding coupled to a grounded power system, a first secondary winding for generating a first output voltage on line conductors of said dual voltage distribution system, and a second secondary winding for generating a second output voltage on line conductors of said dual voltage distribution system;

B. a first line isolation monitor (LIM) coupled to said first secondary winding and to said ground;

C. a second LIM coupled to said second secondary winding and to said ground;

D. wherein said first LIM and said second LIM inject a test current into said ground, said test current having a frequency at a multiple of line frequency of said grounded power system, and wherein said frequency of said test current from said second LIM is different from said test current from said first LIM;

E. wherein said first LIM and said second LIM have a frequency selective voltmeter for measuring a test voltage and a line voltage between each of said line conductors and ground, said test voltage responsive to said test current;

F. wherein said frequency selective voltmeter in said first LIM includes a frequency selective filter having a center frequency selectively tuned to said line frequency when measuring said line voltages of said first output voltage to ground and tuned to said test current frequency of said first LIM when measuring said test voltages;

G. wherein said frequency selective voltmeter in said second LIM includes a frequency selective filter having a center frequency selectively tuned to said line frequency when measuring said line voltages of said second output voltage to ground and tuned to said test current frequency of said second LIM when measuring said test voltages; and H. wherein said first LIM and said second LIM include means for calculating a hazard impedance by dividing said measured test voltage by said test current, and further including means for calculating said hazard current from said hazard impedance by dividing said hazard impedance by a largest line voltage of said measured line voltages between each of said line conductors and ground.

2. The system of claim 1 wherein said first LIM and said second LIM includes means for changing said multiple of said determined line frequency and thereby said test current frequency, said means for also changing said center frequency of said frequency selective filter to equal said changed multiple when measuring said test voltages, said changing means to allow multiple LIMs set to different ratios to be connected on the same power distribution system.

3. The system of claim 1 wherein said frequency selective filters use a Discrete Fourier Transform.

4. The system of claim 1 further including a communication means for outputting measured and calculated data to other devices, said communication means including a serial port and an infrared communication port.

5. The system of claim 1 wherein said isolation transformer, said first LIM, and said second LIM are included on a single isolation panel.

6. The system of claim 5 wherein said isolation panel includes a main circuit breaker coupled to said primary winding of said isolation transformer.

7. The system of claim 5 wherein said isolation panel includes a plurality of circuit breakers coupled to said first secondary winding of said isolation transformer for protecting said first output voltage.

8. The system of claim 5 wherein said isolation isolation panel includes a plurality of circuit breakers coupled to said secondary secondary winding of said isolation transformer for protecting said second output voltage.

9. The system of claim 5 wherein said isolation isolation panel includes an alarm panel coupled to said first LIM and an alarm panel coupled to said second LIM.

10. The system of claim 1 wherein said polyphase distribution system is a single phase system.

11. The system of claim 1 wherein said polyphase distribution system is a three phase system.

* * * * *